(12) United States Patent
Majumdar et al.

(10) Patent No.: US 11,101,102 B2
(45) Date of Patent: Aug. 24, 2021

(54) PHOTOABSORPTION MICROSCOPY USING ELECTRON ANALYSIS

(71) Applicant: The Board of Trustees of the Leland Stanford Junior University, Stanford, CA (US)

(72) Inventors: Arunava Majumdar, Menlo Park, CA (US); Ze Zhang, Stanford, CA (US); Joel Martis, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 17/002,001

(22) Filed: Aug. 25, 2020

(65) Prior Publication Data

US 2021/0066030 A1 Mar. 4, 2021

Related U.S. Application Data

(60) Provisional application No. 62/892,998, filed on Aug. 28, 2019.

(51) Int. Cl.
*H01J 37/22* (2006.01)
*H01J 37/28* (2006.01)
(Continued)

(52) U.S. Cl.
CPC ............ *H01J 37/228* (2013.01); *G01N 21/31* (2013.01); *H01J 37/244* (2013.01); *H01J 37/28* (2013.01);
(Continued)

(58) Field of Classification Search
CPC .......... H01J 37/00; H01J 37/02; H01J 37/228; H01J 37/28; H01J 37/24426; H01J 37/263;
(Continued)

(56) References Cited

U.S. PATENT DOCUMENTS

| 4,860,224 A * | 8/1989 | Cashell | G01N 23/2206 |
| | | | 702/28 |
| 2007/0293766 A1* | 12/2007 | Bakker | G01J 3/42 |
| | | | 600/473 |
| 2019/0311881 A1* | 10/2019 | Lavely | H01J 37/244 |

OTHER PUBLICATIONS

Song Jiang et al., "Subnanometer-resolved chemical imaging via multivariate analysis of tip-enhanced Raman maps", "Light: Science & Applications", Nov. 17, 2017, doi: 10.1038/lsa2017.98, 8 pp.

* cited by examiner

*Primary Examiner* — Jason L McCormack
(74) *Attorney, Agent, or Firm* — Kaplan Breyer Schwarz, LLP (57) ABSTRACT

A method for chemical identification of a sample having nanostructures includes the steps of irradiating the surface at wavelengths for each of a first and a second of the nanostructures that are uniquely absorbed by each of the first nanostructure and the second nanostructure such that each is excited to modulate at a first or a second nanostructure frequency, respectively. The method continues with the steps of irradiating the surface with electron beams incident on each of the first and second nanostructure, wherein at least one of secondary electrons, backscattered electrons and transmitted electrons are modulated at the frequency corresponding to each of the first and second nanostructure frequencies. A chemical map of the sample at an atomic scale is then created. A microscope is provided to carry out the method.

8 Claims, 11 Drawing Sheets

(51) Int. Cl.
*H01J 37/244* (2006.01)
*G01N 21/31* (2006.01)
(52) U.S. Cl.
CPC .............. *G01N 2021/3125* (2013.01); *H01J 2237/2802* (2013.01)
(58) Field of Classification Search
CPC ............ H01J 2237/2802; G01N 21/31; G01N 2021/3125; G01N 23/225
USPC .......................................... 250/306, 307, 311
See application file for complete search history.

PHOTOABSORPTION MICROSCOPY USING ELECTRON ANALYSIS

CROSS-REFERENCE TO RELATED APPLICATION

This application claims priority to U.S. Provisional Patent Application No. 62/892,998 filed Aug. 28, 2019, entitled Photoabsorption Microscopy Using Electron Assays, pending.

FIELD OF THE INVENTION

The present invention relates to microscopy, and, more particularly, to optical imaging, chemical identification and temperature mapping approaching atomic scale.

Optical imaging provides rich information about the energy states of materials, which is important in fields such as quantum information, catalysis, optoelectronics and structural biology. The performance and properties of nano-engineered materials are usually different from their bulk counterparts, owing to atomic scale anomalies such as defects, interfaces, surface functional groups, and absorbed molecules. Therefore, techniques that provide optical imaging at the atomic scale offer fundamental insights and greatly enhance the ability to design novel materials, and advance research in many fields.

In the early 1980s, the emergence of scanning tunneling microscopy (STM) changed the landscape of surface science by offering the ability to image single atoms in conducting materials, which led to Nobel Prize in Physics in 1986. The same year saw the invention of the atomic force microscope (AFM), which also revolutionized the surface science by offering the ability to image all materials with atomic resolution. This led to the inventions of a variety of scanning probe microscopes (SPMs) that interrogate a surface at nanometer scales using some near-field interaction, such optical, magnetic, electrostatic, force, thermal, etc. Yet, chemical identification at nanometer scales remained a challenge.

In the realm of electron microscopy, there have been significant improvements over the last decade to develop aberration corrected transmission electron microscopes (TEMs), where the research was largely conducted in the Department of Energy National Laboratories. TEMs have now achieved sub-Angstrom spatial resolution using high energy electrons (60-300 keV) with picometer wavelengths, and thereby can image single atoms. However, the energy mismatch between such high energy electrons and valence/vibrational electronic states (meV to a few eV) limits the chemical information aberration corrected TEMs can provide. Only recently has it become possible to resolve sub-eV excitations in materials using electron energy loss spectroscopy (EELS), but this requires specialized and expensive instrumentation. While Auger spectroscopy can achieve chemical identification, atomic or molecular-scale imaging with these techniques are not feasible. The same is true of low-energy electron microscopy (LEEM), which is highly surface and element sensitive, but cannot be used for near-atomic scale imaging.

In the realm of optical microscopy, a major breakthrough in the form of photoactivated localization microscopy (PALM) was reported in 2006. PALM was able to overcome the Abbe diffraction limit of traditional far-field microscopes by selectively photoactivating one species of fluorophores at a time and noting their location with nanometer-scale resolution, and then photoactivating other species at different times. The time-resolved images were then reassembled to recreate a composite image. The ability to use traditional optical microscopes to go down to nanometer-scales transformed biological imaging, and it was awarded the Nobel Prize in Chemistry in 2014. While PALM can offer chemical imaging, it relies heavily on fluorescent dye molecules and their attachment to other biomolecules of interest. Despite its success, PALM cannot spectroscopically identify molecules with the use of fluorophores.

Nanometer-resolution optical spectroscopic imaging offers fundamental insights of light-matter interactions that have significant bearing on understanding optoelectronic properties of molecules and inorganic nanostructures, surface chemical reactions, and defect engineering.

Although many optical spectroscopy and imaging techniques like Raman, photoluminescence and IR spectroscopy are widely used for materials characterization, their spatial resolutions are limited by the wavelength of light used, which is hundreds of nanometers to microns. Various techniques like near field or stochastic fluorescence super-resolution imaging, and scanning probe microscopy (SPM) or scanning tunneling microscopy (STM) have been developed to break this diffraction limit. However, their spatial resolutions are still limited and not adequate to image atomic scale features. In addition, near field and scanning probe based techniques have poor depth of field and are only surface sensitive, while fluorescence based techniques need stable fluorescent labels. Although certain STM based optical spectroscopy techniques have achieved sub-nanometer resolution, tip convolution and substrate based effects have complicated data interpretation. Sub-nanometer and atomic resolution label-free optical imaging still remains elusive.

It would be beneficial to provide an improvement in existing microscopy and spectroscopy methods, offering nanometer scale resolution with surface chemical information.

BRIEF DESCRIPTION OF THE DRAWINGS

FIG. 3A through FIG. 3F depict high resolution photoabsorption mapping of silicon nanoparticles on an aluminum coated silicon substrate. FIG. 3E and 3F depict signal spectrum at two representative pixels indicated by the two white crosses in FIG. 3A and FIG. 3B.

FIG. 4A through FIG. 4I depict mapping on nanoparticles. FIGS. 4A-4C depict sub-diffraction limit mapping of silicon particles where FIG. 3C is a lock-in image with 980 nm excitation.

FIG. 6A through FIG. 6A depict TEM simulations of an anti-site nitrogen vacancy $N_BV_N$ defect in monolayer h-BN.

FIG. 7A through FIG. 7E depict simulation results of $Ru(bpy)_3^{2+}$.

SUMMARY OF THE INVENTION

A method for chemical identification of a surface of a sample having a plurality nanostructures is provided where each nanostructure has a different radiation absorption spectra. The method first includes the steps of irradiating the surface at a first wavelength for a first of the plurality of nanostructures that is uniquely absorbed by the first nanostructure such that the first nanostructure is excited to modulate at a first nanostructure frequency, and irradiating the surface at a second wavelength for a second of the plurality of nanostructures that is uniquely absorbed by the second nanostructure such that the second nanostructure is excited to modulate at a frequency corresponding to the second nanostructure. The method continues with the steps of irradiating the surface with an electron beam, wherein when the electron beam is incident on the first nanostructure, wherein at least one of secondary electrons, backscattered electrons and transmitted electrons are modulated at the frequency corresponding to the first nanostructure frequency, and wherein when the electron beam is incident on the second nanostructure, wherein at least one of secondary electrons, backscattered electrons and transmitted electrons are modulated at the frequency corresponding to the second nanostructure frequency. Finally, the method continues with the step of creating a chemical map of the sample at an atomic scale.

The method produces satisfactory results without fluorescence, luminescence and/or modification of the sample. The steps of irradiating the surface with an electron beam may be via a narrow focused probe in a scanning electron microscope (SEM) or a scanning transmission electron microscope (STEM). The steps of irradiating the surface with an electron beam may be via a parallel electron beam in a transmission electron microscope (TEM).

A photoabsorption microscope to perform chemical identification of a surface having more than one nanostructures, where each nanostructure having different radiation absorption spectra is also provided. The photoabsorption microscope includes a scanning electron microscope, a scanning transmission electron microscope or a transmission electron microscope. The microscope includes a laser to irradiate the surface at a first wavelength for a first of the plurality of nanostructures that is uniquely absorbed by the first nanostructure such that the first nanostructure is excited to modulate at a first nanostructure frequency, the laser to irradiate the surface at a second wavelength for a second of the plurality of nanostructures that is uniquely absorbed by the second nanostructure such that the second nanostructure is excited to modulate at a frequency corresponding to the second nanostructure. The microscope further includes an electron emitter to emit an electron beam on the surface, incident on the first nanostructure, wherein at least one of secondary electrons, backscattered electrons and transmitted electrons are modulated at the frequency corresponding to the first nanostructure frequency, and the electron emitter to emit the electron beam on the surface, wherein when the beam is incident on the second nanostructure, at least one of secondary electrons, backscattered electrons and transmitted electrons are modulated at the frequency corresponding to the second nanostructure frequency. Finally, the microscope includes a detector for measuring at least one of secondary electron yield, backscattered electron distribution, transmitted electron imaging, and electron loss and gain spectrum.

The laser may be adapted to irradiate at least one additional nanostructures and the electron emitter is adapted to emit an electron beam on the at least one additional nanostructures.

Brief Description of the Preferred Embodiment

Figure 1:
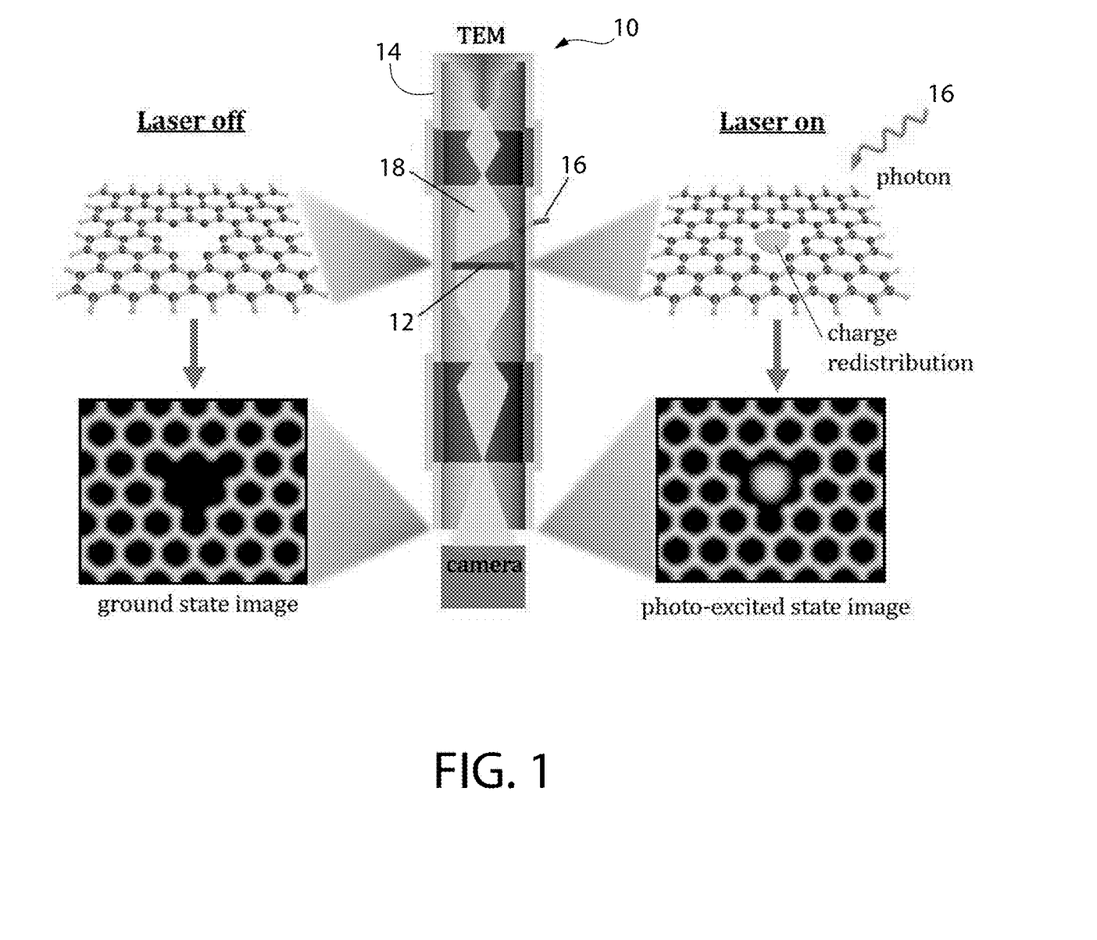
FIG. 1 depicts a simplified schematic diagram of a photoabsorption microscope using electronic analysis with transmission electron microscope in accordance with an illustrative embodiment of the present invention, shown with examples of a sample and a resulting image with a laser of the present invention in both an on and an off configuration.

The present invention is directed to PhotoAbsorption Microscopy using Electron Analysis (PAMELA), an imaging technique which combines spectrally specific photoabsorption with atomic resolution transmission electron microscopy to obtain optical imaging at nanometer and atomic scale. FIG. 1 depicts a PAMELA system 10 in accordance with an exemplary embodiment of the present invention, where a sample 12 is optically excited in-situ in a TEM 14 during high resolution TEM imaging through a TEM holder with optical fiber laser 16.

In the system 10, the optical fiber laser 14 is disposed on the TEM 14 to optically excite the sample 12. With the laser 16 off (see left side of FIG. 1), the TEM 14 images the ground state electrostatic potential of the sample 12 which provides structural information. When the laser 16 is on (see right side of FIG. 1), photoexcitation of a defect in the sample 12 leads to a localized charge redistribution, which is then imaged by the TEM 14. The difference between the photo-excited state (see right side of FIG. 1) and the ground state high resolution transmission electron microscope (HR-TEM) image provides optical information of the defect state of the sample.

Every atom or molecule absorbs photons with its unique spectrum. Upon optical excitation, the electron density is redistributed in the optically active areas, while other areas are unaffected. This change of charge distribution and electrical potential produces atomic scale contrast in the final high resolution HRTEM image.

Figure 2:
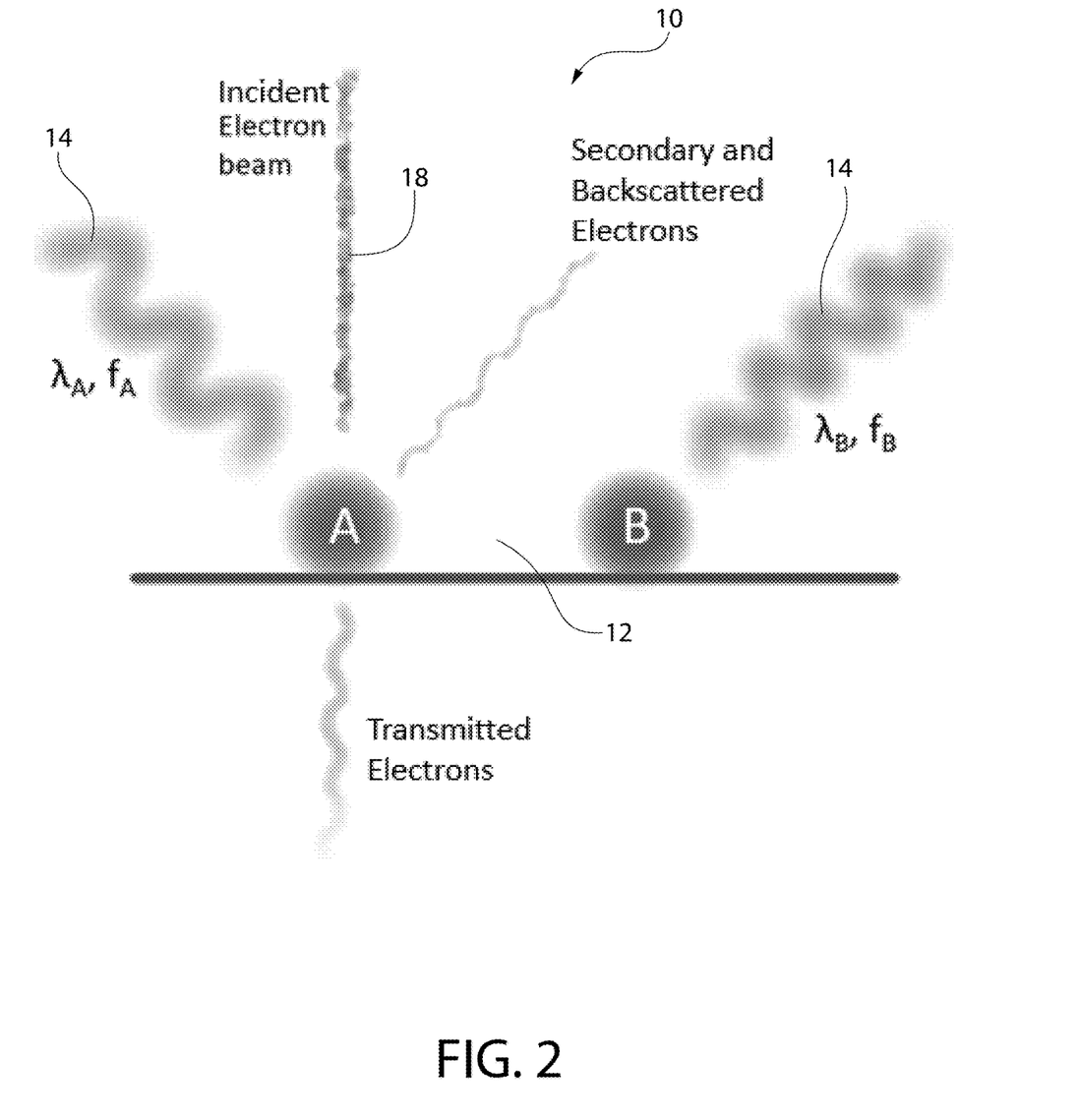
FIG. 2 depicts a simplified schematic of the operation of the photoabsorption microscope of FIG. 1.

A schematic diagram of the PAMELA system 10 is shown in FIG. 2. The sample 12 contains two types of molecules or nanostructures, A and B, of sizes $d_A$ and $d_B$ respectively (however, the invention is not limited to just two types of molecules or nanostructures). These nanostructures A, B will have different radiation absorption spectra in the ultraviolet/visible (electronic excitations), infrared (vibrational excitations), or microwave range (rotational excitations). An incident radiation beam (laser 14) at wavelength $\lambda_A$ that is uniquely absorbed by nanostructure A, whose intensity is modulated at frequency $f_A$. A different incident radiation beam (laser 14) at $\lambda_B$ that is uniquely absorbed by nanostructure B, whose intensity is modulated at frequency $f_B$. When the nanostructure A absorbs radiation at wavelength $\lambda_A$, it will undergo an excitation that will be modulated at frequency $f_A$. Now, an incident electron beam 18 which could either be a narrow focused probe in a scanning electron microscope (SEM) or scanning transmission electron microscope (STEM) with FWHM b nm or a parallel electron beam in a transmission electron microscope (TEM). When this beam is incident on nanostructure A, the secondary electrons, backscattered electrons and transmitted electrons will be modulated at the frequency $f_A$ due to the modulated excitation. In SEM, one would typically detect secondary or backscattered electrons, and in STEM/TEM, one would detect transmitted electrons. These transmitted electrons can be either used to form high resolution imaging, or analyzed by Electron Energy Loss Spectroscopy (EELS) to study the inelastic scattering and energy transfer between the incident electrons and the samples. By locking in to this detected signal at $f_A$, one would pick up any photoabsorption signal corresponding to wavelength $\lambda_A$ and therefore it would be possible to image the corresponding photoabsorption centers in the sample. The same principle would apply to nanostructure B. It should then be possible to create a chemical map of the sample at the atomic scale based on its absorption properties.

The resolution of this final image would be determined by the probe size in SEM/STEM. Modern SEMs and STEMs can achieve sub-nanometer probe sizes, which would make PAMELA an atomic resolution technique in SEM/STEM. In the case of TEM, the resolution of the final image is determined by the wavelength of electrons combined with lens aberrations. State of the art TEM imaging routinely achieves sub-angstrom resolution, so it is reasonable to expect that one would detect photoabsorption driven changes at the atomic scale.

EXAMPLE 1

Figure 3A:
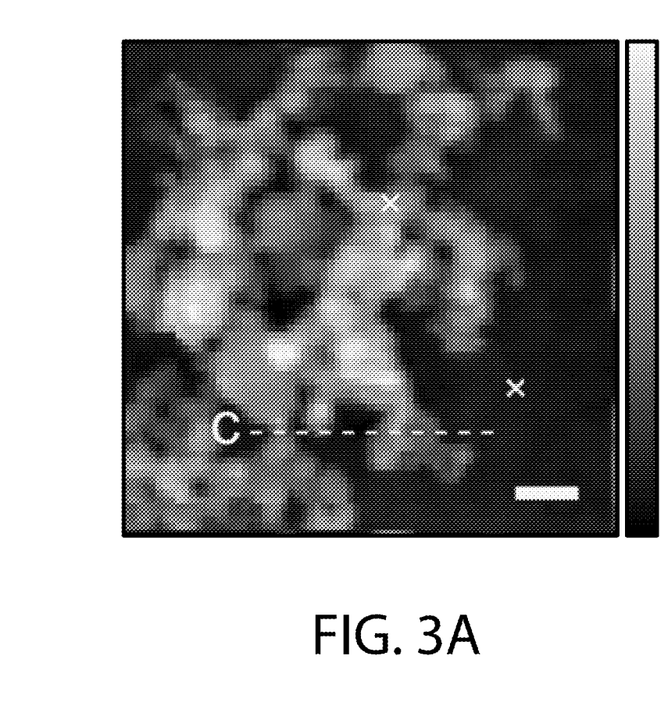
FIG. 3A is a DC topographical image (typical of an SEM) formed by integrating the secondary electron signal at each pixel.
Figure 3B:
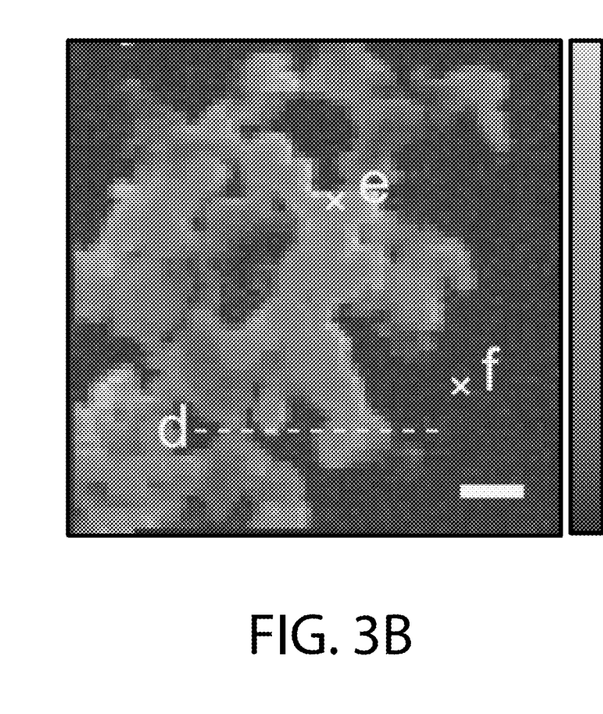
FIG. 3B is a lock-in image with 532 nm excitation. The laser intensity is modulated at 2.35 kHz. This plot has 75×75 pixel and 80 ms dwell time at each pixel. Total imaging time is less than 8 minutes.
Figure 3C:
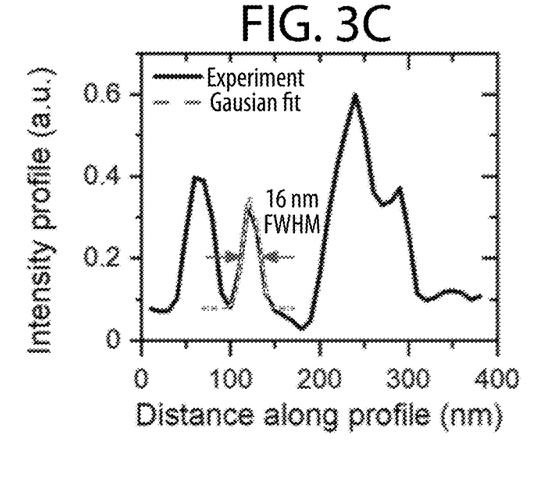
FIGS. 3C and 3D depict line profile along the white dashed line in of FIG. 3A and 3B, respectively, where features with <20 nm full width half maximum (FWHM) is clearly resolved, and demonstrated far beyond optical diffraction limit imaging.
Figure 3D:
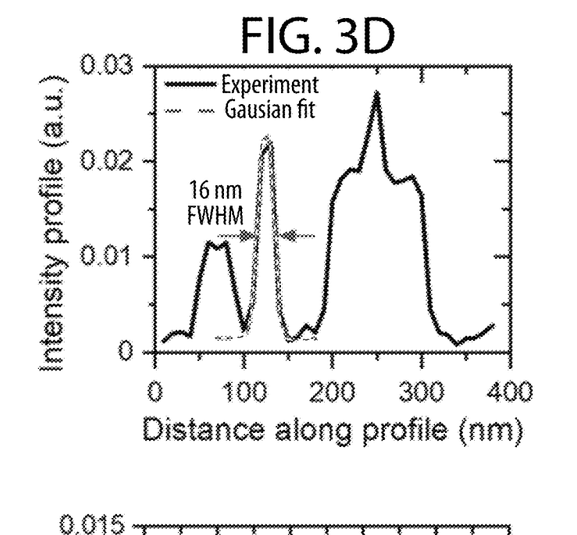
Figure 3E:
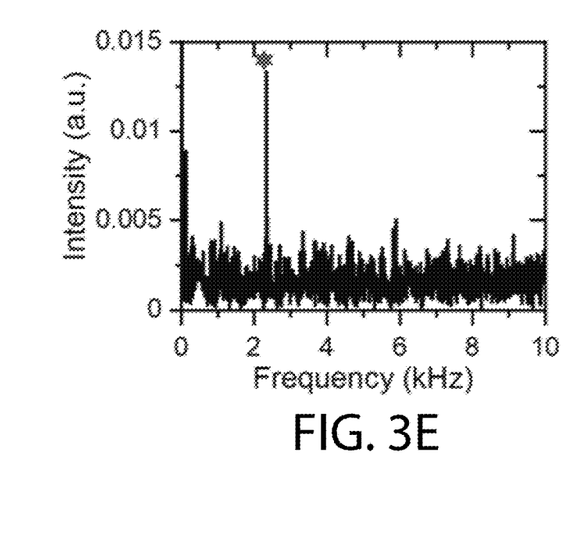
FIG. 3E depicts a spectrum of the signal from a pixel on the silicon nanoparticle, where clear 2.35 kHz component is seen.
Figure 3F:
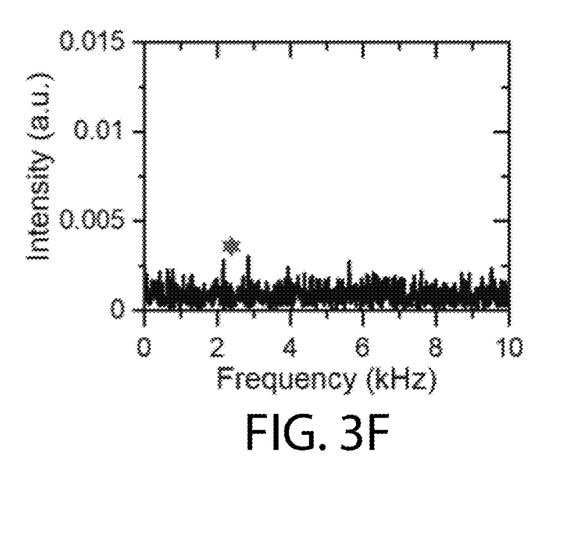
FIG. 3F depicts a signal from a pixel on the aluminum substrate, where the 2.35 kHz component is below the noise level.

PAMELA-SEM is first demonstrated by investigating silicon nanoparticles on an aluminum coated silicon substrate. Aluminum is the selected as the substrate because it possesses high optical reflectivity in the visible to near infrared range (including 532 nm and 980 nm), and provides good electrical conductivity and grounding to avoid sample charging during SEM imaging. A continuous wave laser at l=532 nm of ~300 mW maximum power is brought to the sample through a multimode optical fiber with an incidence angle of 25 degree and a spot size of ~120 µm in full width half maximum (FWHM), yielding an optical flux of ~10 µW/µm$^2$ (or ~10$^3$ W/cm$^2$). The electron beam is then raster scanned across an area that is typically less than 1 µm×1 µm, and the secondary electron yield signal is collected as a time series at a 100 kHz sampling rate. The time series data is binned into 75×75 pixels to form an image, and the effective dwell time at each pixel used here is typically 80 ms. Hence, the whole image takes less than 8 minutes. At each pixel, the DC value of the time series forms the normal SE image (FIG. 3A). The amplitude of the fast Fourier transform (FFT) of the time series at the laser modulation frequency (2.35 kHz) is normalized using the corresponding DC value and plotted pixel-by-pixel to reconstruct the lock-in image (FIG. 3B). The FFT spectrum of two representative pixels are shown in FIGS. 3E and 3F. For a pixel on the silicon nanoparticles, a peak at 2.35 kHz is clearly observed, which indicates that the photoexcitation due to absorption of 532 nm laser and the modulation of the secondary electron signal from the silicon nanoparticles. In contrast, when the electron beam is incident on the aluminum substrate, no such peak is observed, which means that the presence of laser does not affect the secondary electron yield, or the effect is below the detection limit of our noise floor. FIG. 3D shows a line profile of the lock-in image (indicated by the white dashed line), which reveals photoabsorption features that are <20 nm in FWHM. The feature size is similar with that of the topographical image (FIG. 3C), which is determined by the SEM itself. This demonstrates PAMELA's ability to achieve photoabsorption imaging far below the diffraction limit.

Figure 4A:
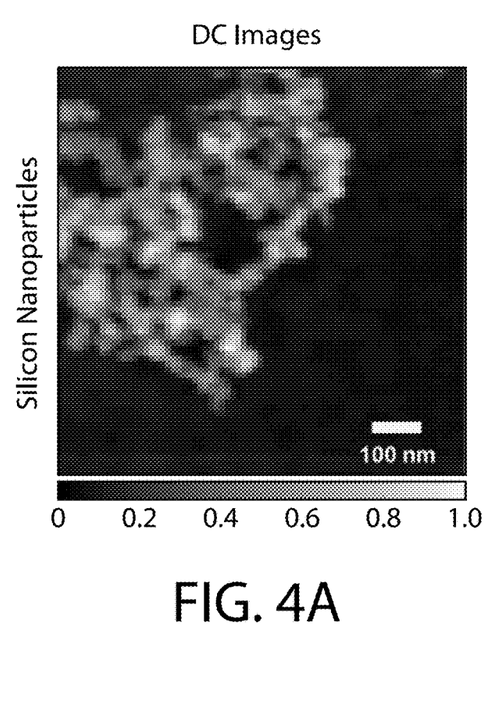
FIG. 4A is a DC image (regular SEM SE topographical)
Figure 4B:
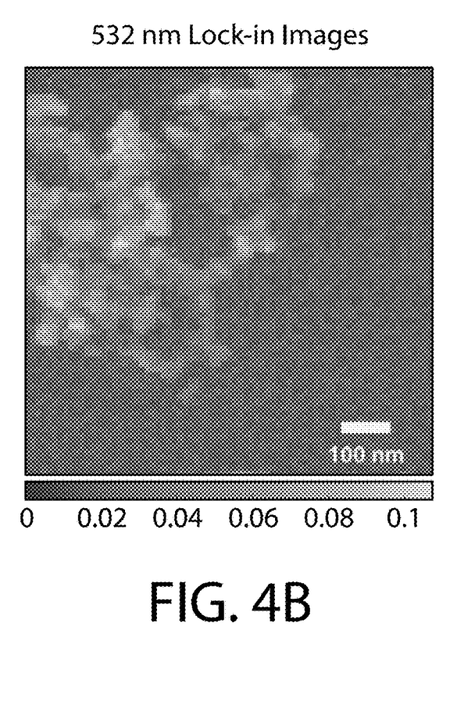
FIG. 4B is a lock-in image with 532 nm excitation.
Figure 4C:
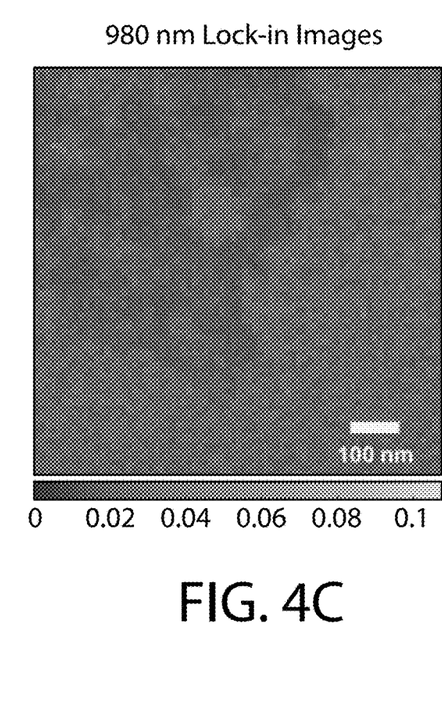
Figure 4D:
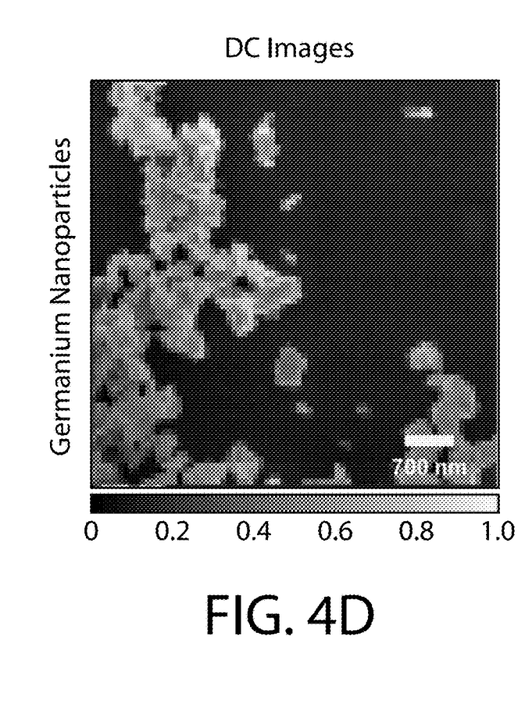
FIGS. 4D-4F depict DC images; lock-in image with 532 nm excitation and 980 nm excitation of germanium nanoparticles, respectively.
Figure 4E:
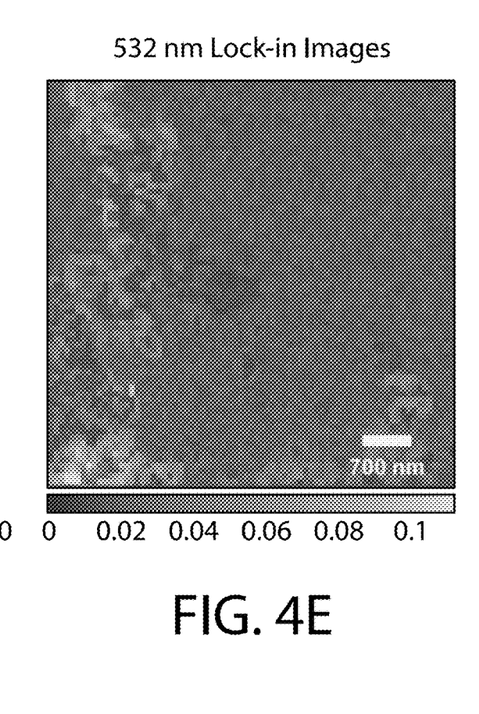
Figure 4F:
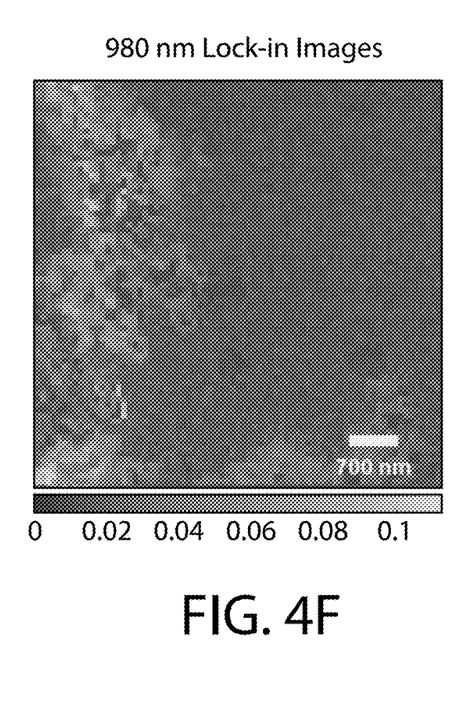
Figure 4G:
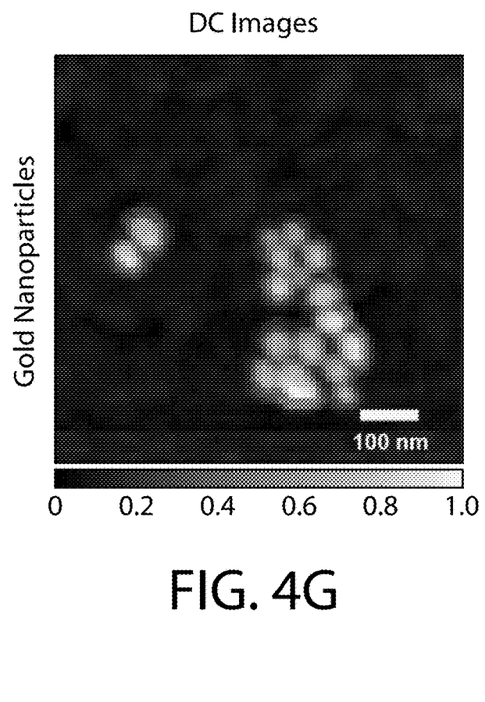
FIGS. 4G-4I depict DC images; lock-in image with 532 excitation and with 980 nm excitation of gold nanoparticles, respectively.
Figure 4H:
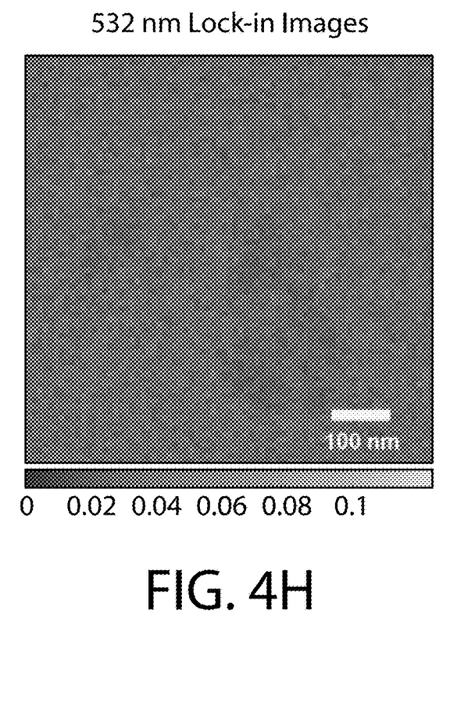
Figure 4I:
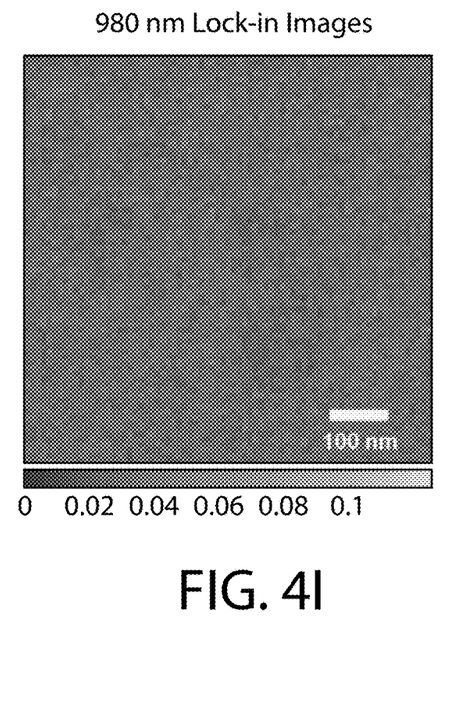

Next, two continuous wave lasers at 532 nm and 980 nm are used to separately excite the samples. FIG. 4A shows the DC topographical secondary electron images, 532 nm and 980 nm lock-in images for silicon nanoparticles, germanium nanoparticles and gold nanoparticles. For silicon nanoparticles, the secondary electron emission signal is only modulated by the 532 nm laser (FIG. 4B), but not by the 980 nm laser (FIG. 4C). This distinct spectroscopic contrast can result from the large difference in absorption coefficient, $\alpha$, of silicon at 532 nm ($\alpha \sim 10^4$ cm$^{-1}$) and 980 nm ($\alpha \sim 10^2$ cm$^{-1}$). For germanium, the absorption coefficients are high at both wavelengths ($\alpha \sim 6 \times 10^5$ cm$^{-1}$ and $2 \times 10^4$ cm$^{-1}$ at 532 nm and 980 nm, respectively). Consequently, germanium nanoparticles show laser modulated secondary electron emission for both 532 nm and 980 nm photoexcitation (FIG. 4E and FIG. 4F). Gold as a metal reflects most visible and infrared wavelengths and has much shorter carrier lifetime compared with semiconductors. Hence, no modulated secondary emission is detected with either wavelength (FIG. 4H and FIG. 4I).

The present invention will allow surface chemical imaging at molecular or nanometer scales in a SEM, and detection of electron orbital structure in a TEM, both of which have been challenging problems in microscopy. Once this is achieved, it would directly lead to deep insights about how molecules bind to and interact with a surface, how atoms and molecules react with each other on a surface, and how electrons in atoms and molecules interact with radiation. This would have application, for example, on studies about surface catalysis, defects engineering, nanoscale local optical properties, quantum materials, etc.

While the above describes PAMELA for only three types of nanostructures and two laser wavelengths, it can be extended to distinguish more types of nanostructures or molecules by using several different wavelengths of light which are modulated at different frequencies. There is no fundamental limit of how many kinds of nanostructures this method can distinguish.

The photo-absorption based excitation can be detected using a variety of electron analysis like a focused probe in a Scanning Electron Microscope (SEM), a focused probe in a Scanning Transmission Electron Microscope (STEM), or a parallel beam in a Transmission Electron Microscope (TEM). This makes the technique available to a broad variety of samples. For example, one could study surface chemistry of a bulk sample in an SEM, the electronic structure and light matter interactions at the atomic level in a STEM/TEM, and molecular structure of biological specimen in a Cryo-TEM.

The present invention combines selective optical absorption with electron analysis to achieve nanometer scale optical spectroscopy.

EXAMPLE 2

In a second exemplary embodiment of the present invention, ab initio and HRTEM simulations are used to estimate the signal level and experimental parameters needed for PAMELA-TEM. The electron wave function and charge density distribution of the ground and photoexcited states are calculated using self-consistent density functional theory (DFT). From these charge distributions, electrical potentials of the sample are solved using Poisson's equation. HRTEM simulations are then performed to get the electron phase change using the multi-slice method. Finally considering the effect of microscope lens aberrations, and camera pixilation and noise, the final HRTEM images of the ground and excited states are obtained. In the following, simulation results for two model systems: defects in hexagonal Boron Nitride (h-BN), and tris(bipyridine)ruthenium(II) (Ru(bpy)$_3^{2+}$) ions.

Defects in h-BN have recently been discovered to host room-temperature single photon emitters (SPEs) with applications in quantum computing. Despite the wide interest, the origin of these SPEs is still under debate. Several studies have attempted to infer the correlation between the atomic scale defect structures and optical properties. Here, PAMELA-TEM provides a platform to directly image photoexcited states of defects in h-BN, thus establishing a conclusive correlation between the atomic structure and optical properties.

Figure 5A:
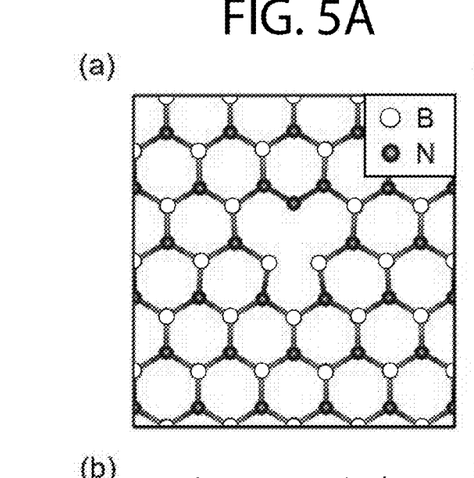
FIG. 5A depicts simulation atomic structure of an anti-site nitrogen vacancy $N_BV_N$ defect in monolayer h-BN.
Figure 5B:
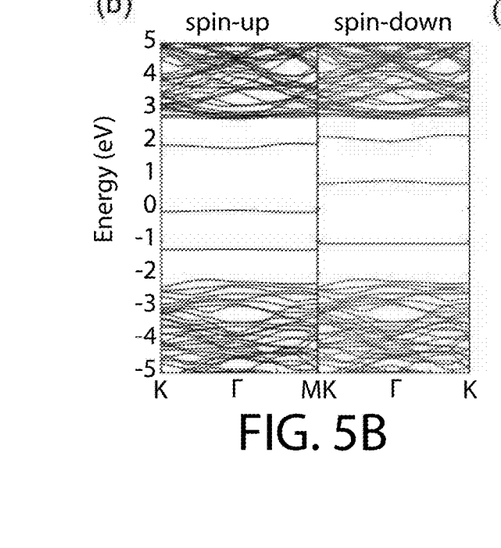
FIG. 5B depicts simulation spin-polarized band structure of the anti-site nitrogen vacancy $N_BV_N$ defect in monolayer h-BN of FIG. 5A.
Figure 5C:
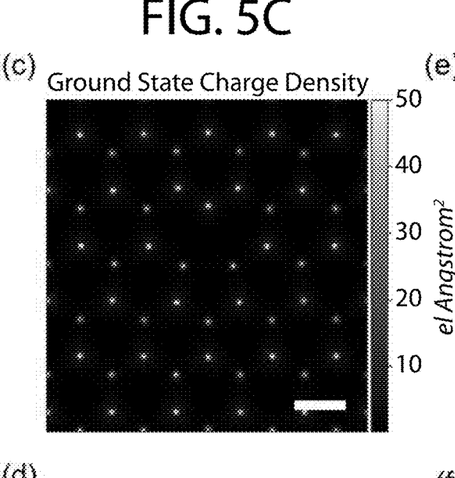
FIG. 5C depicts ground state projected charge density distribution structure of the anti-site nitrogen vacancy $N_BV_N$ defect in monolayer h-BN of FIG. 5A.
Figure 5D:
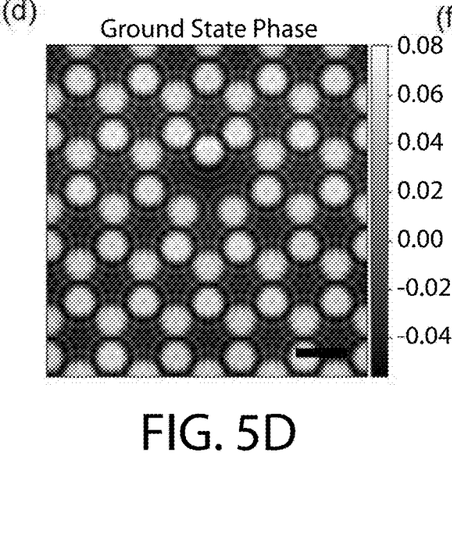
FIG. 5D depicts phase change of the exit electron beam after going through the sample at the ground state of the anti-site nitrogen vacancy $N_BV_N$ defect in monolayer h-BN of FIG. 5A.
Figure 5E:
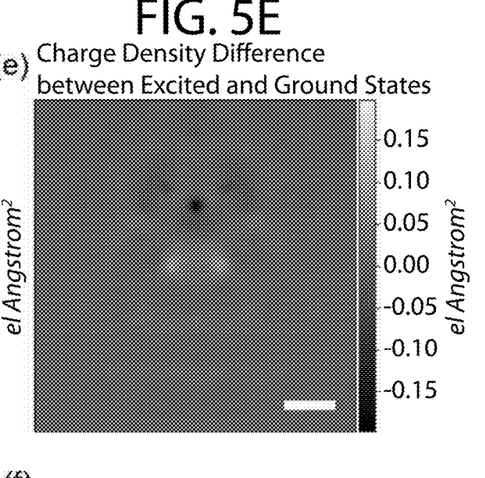
FIG. 5E depicts charge redistribution due to photo excitation of the anti-site nitrogen vacancy $N_BV_N$ defect in monolayer h-BN of FIG. 5A.
Figure 5F:
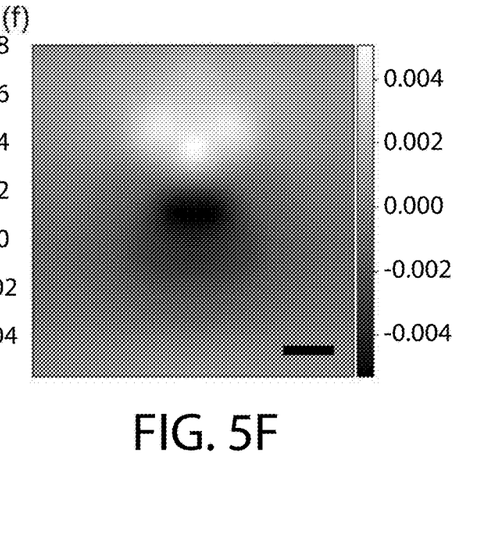
FIG. 5F depicts the difference of phase change between the photoexcited state and the ground state of the anti-site nitrogen vacancy $N_BV_N$ defect in monolayer h-BN of FIG. 5A, where the electron phase change is simulated using 60 keV incident electron beam energy and where the scale bars are 2 Å.

DFT simulations are used to calculate the band structure (FIG. 5(b)) and the electron distribution for an anti-site nitrogen vacancy NBVN defect in monolayer h-BN (FIG. 5(a)). Pristine h-BN has a wide band gap, while defects introduce in-gap states. This $N_B V_N$ defect is proposed to be a single photon emitter according to reference. The defect induced in-gap states can be optically excited by choosing specific laser wavelengths. FIG. 5(c) shows the projected ground state electron charge distribution. Upon photoexcitation, electrons are excited to higher energy states, and this causes charge redistribution as shown in 5(e). The charge from the nucleus is added, and multislice simulations are performed with 60 keV incident electron beams. FIG. 5(d) shows the electron phase maps for the ground state potential and FIG. 5(f) is the difference phase map due to charge redistribution. The electron phase difference between the ground state and the excited state preserves the atomic scale feature from the charge density distribution.

Figure 6A:
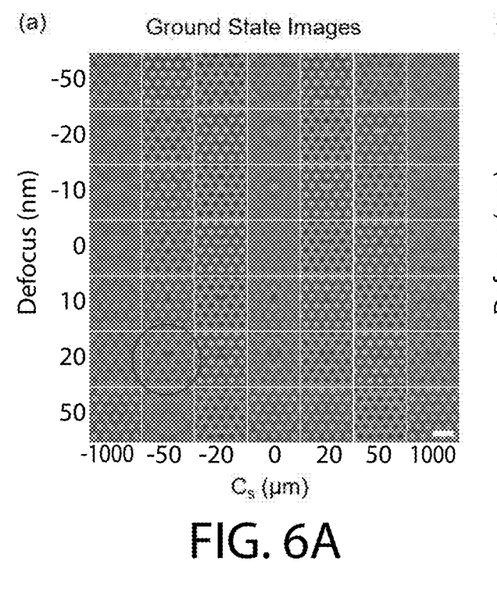
FIG. 6A depicts a structural image under different defocus and aberration coefficient.
Figure 6B:
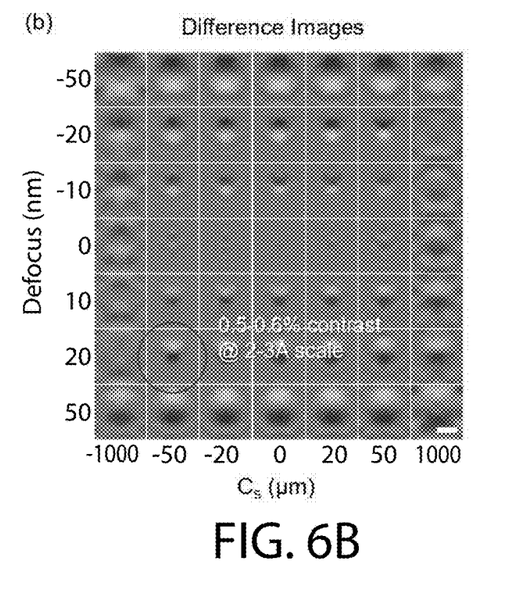
FIG. 6B depicts an optical image obtained by calculating the difference between the excited and ground state images, where the circled image shows the condition for simulations with noise.
Figure 6C:
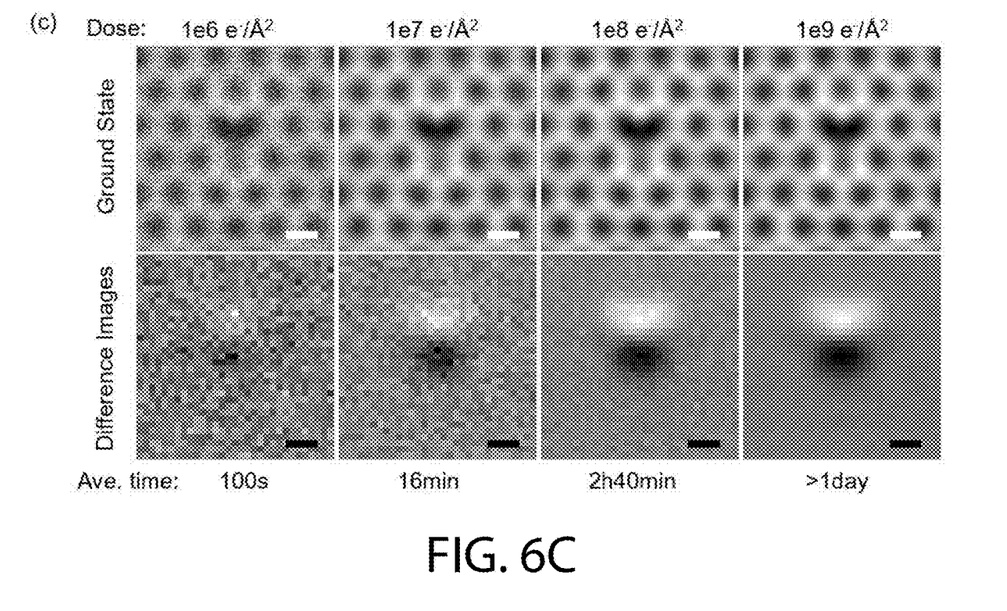
FIG. 6C depicts top row images of ground state (0.1 Å/pixel sampling rate) and the bottom row images of the difference between the excited and ground state images (0.4 Å/pixel binning). The different columns show different doses (1e6-1e9 $e^-Å^2$) and corresponding acquisition time (100 s-1 day). Scale bars are 5 Å in (a)(b), and 2 Å in (c).

Next, HRTEM images are generated using a wide variety of lens defocus and aberration values for both the ground state (FIG. 6(a)) and the excited state. The difference images are shown in FIG. 6(b). It is clear that there is a compromise between contrast and spatial resolution—while a smaller defocus produces sharper features, it is inevitably accompanied by a decrease in contrast. Also, it is seen that while an uncorrected microscope (Cs~1 mm) can resolve the pristine lattice, aberration correction is needed to resolve the detailed defect structure. The actual HRTEM image captured by the camera needs to consider noises like shot noise of electrons and camera noise. A defocus of 20 nm and a spherical aberration coefficient of −50 μm (circled images in FIGS. 6(a) and (b)) may be chosen, and shot noise and camera noise may be added to the calculation. Images with electron doses from 1e6 to 1e9 e$^-$/Å2 are shown in FIG. 6(c). The pixel sizes are 0.1 Å for the DC image and binned to 0.4 Å for the difference image. This binning helps reduce the shot noise in the difference images. Assuming a dose rate of 10,000 e$^-$/Å$^2$/s, acquisition times in FIG. 6(c) vary from 100 seconds to more than 1 day for the doses listed above. After about 100 s of averaging, the optical signature of the excited state starts to be visible, while 16 minutes of averaging makes the difference image much clearer. This demonstrates atomic scale imaging with optical information using PAMELA-TEM.

Apart from defects in h-BN, a study was made of tris (bipyridine)ruthenium(II) (Ru(bpy)$_3^{2+}$), which is a transition metal complex widely used in optical chemical sensing and photoelectrochemistry. When photoexcited, Ru(bpy)$_3^{2+}$ exhibits metal to ligand charge transfer involving an electron going from a singlet to a triplet state, which results in the excited state having an exceptionally long lifetime, of the order of hundreds of nanoseconds at room temperature. Here, PAMELA-TEM allows us to directly visualize this charge transfer process at the atomic scale for the first time.

Figure 7A:
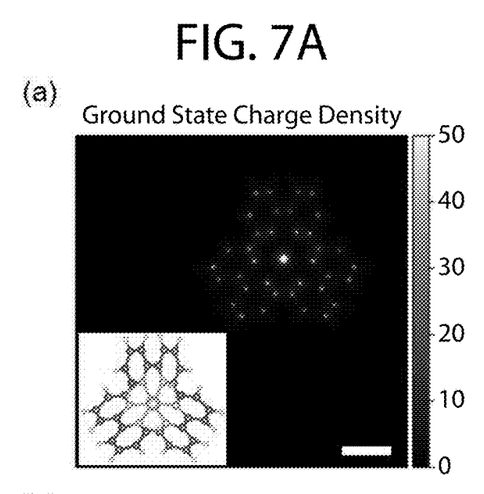
FIG. 7A is ground state projected charge density distribution. The inset is the atomic structure. The contrast is adjusted such that the center Ru is saturated to make other atoms visible.
Figure 7B:
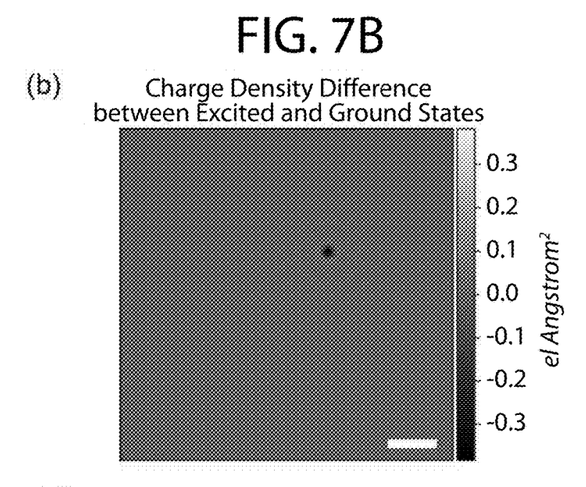
FIG. 7B depicts charge redistribution due to photoexcitation.
Figure 7C:
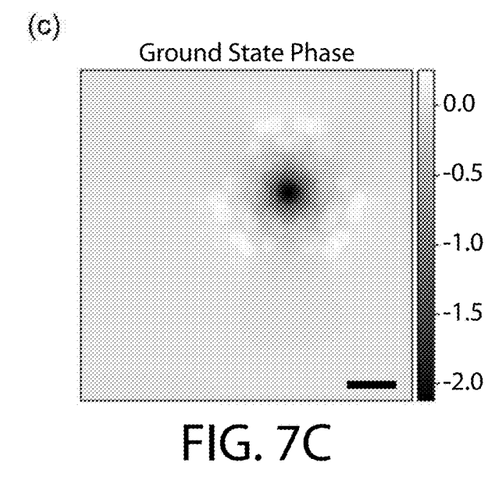
FIG. 7C depicts phase change of the exit electron beam after going through the sample at ground state.
Figure 7D:
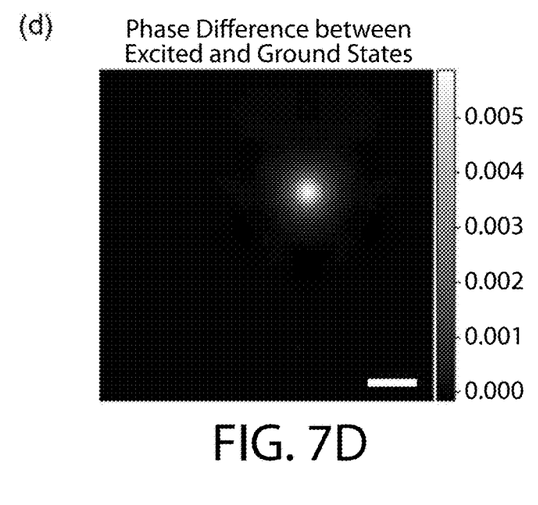
FIG. 7D depicts the difference of phase change between the photoexcited state and the ground state. The electron phase change is simulated using 60 keV incident electron beam energy.
Figure 7E:
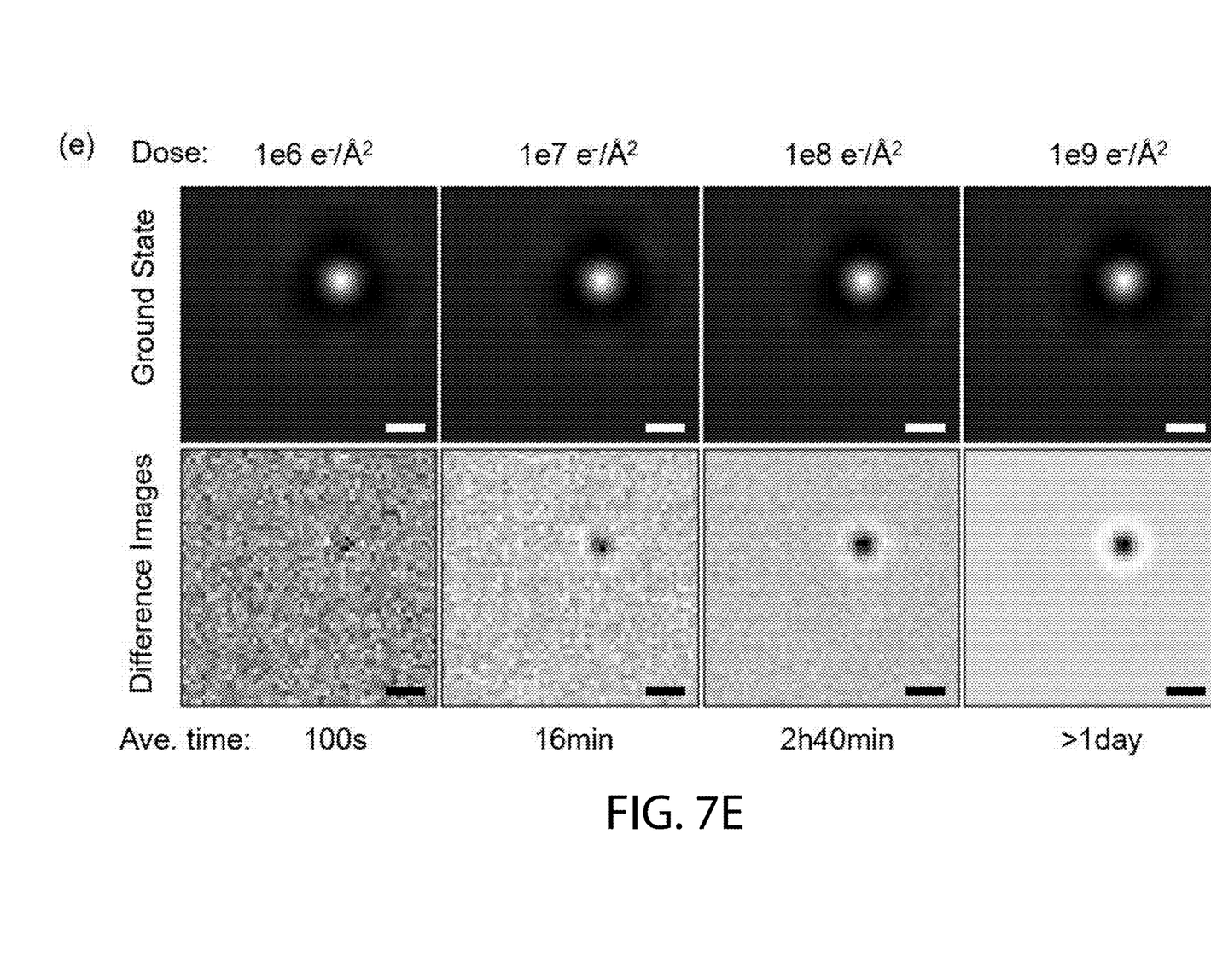
FIG. 7E depicts final TEM images of the ground state and difference between the excited and the ground state with different doses and averaging time. Defocus=−30 nm, Cs=70 µm. Scale bars are 3 Å.

FIGS. 7(a) and 7(b) show the charge distribution for the ground state of Ru(bpy)$_3^{2+}$ and the charge redistribution upon photoexcitation, respectively. It is seen that photoexcitation delocalizes one electron from the Ruthenium atom to the ligands. The simulated electron phase difference image (FIG. 7(d)) shows a 3 Å diameter spot corresponding to the location of the localized charge prior to photoexcitation. Adding camera pixelation (1 Å/pixel) and shot noise, (FIG. 7(e)) shows that photoexcitation contrast becomes visible with a net electron dose of 10$^7$ e$^-$/Å$^2$, requiring 16 minutes of imaging time with a dose rate of 10,000 e/Å$^2$/s.

Since photoexcitation driven charge redistribution is relatively small (<1 e$^-$/Å$^2$), it requires a large dose (>10$^6$ e$^-$/Å$^2$) to produce sufficient contrast for imaging. The feasibility of PAMELA-TEM therefore depends on the maximum dose a material can withstand before degrading under the electron beam. Degradation typically occurs via (i) knock on events, where a primary electron undergoing elastic scattering with the nucleus transfers sufficient energy to dislodge the nucleus, or (ii) radiolysis, where a primary electron undergoes inelastic scattering and produces secondary electrons within the material that degrade chemical bonds. Knock on damage typically occurs only above a certain threshold voltage. Pristine h-BN has been found to have a knock-on threshold of approximately 80 keV for Boron, and 120 keV for Nitrogen. Defects, however, are more susceptible and have lower damage thresholds, around 40-60 keV. This suggests that a low voltage HRTEM might be ideal for imaging photoexcited states. Low voltage imaging has the additional benefit of increased contrast per electron. Organic molecules such as $Ru(bpy)_3^{2+}$ are highly susceptible to radiolysis in addition to knock on damage, and can typically withstand only about 100-1000 $e^-/Å^2$ before degradation. Since radiolysis increases with decreasing voltage, one might expect an optimum voltage with a compromise between knock-on damage and radiolysis. However, the ratio of contrast to inelastic scattering cross section is almost independent of incident electron energy for typical electron beam energies. While liquid nitrogen specimen cooling has been found to help, other possibilities such as averaging over many molecules could prove useful. Averaging is routinely done in cryo-EM where samples are highly dose sensitive (<100 $e^-/Å^2$), which then raises the possibility of PAMELA being combined with cryo-EM to chemically image biomolecules and proteins.

In summary, the present invention is directed to an imaging technique called PAMELA which combines optical excitation and electron microscopy to achieve atomic scale optical imaging. The feasibility has been discussed using DFT and HRTEM simulations. As PAMELA relies on the inherent light absorption and electron charge redistribution, it could be a more general approach for materials characterization. This will open new opportunities in multiple fields such as defect engineering, heterogeneous catalysis, biosensing and imaging.

It is to be understood that the disclosure teaches just some examples of the illustrative embodiment and that many variations of the invention can easily be devised by those skilled in the art after reading this disclosure and that the scope of the present invention is to be determined by the following claims.

What is claimed is:

1. A method for chemical identification of a surface of a sample having a plurality nanostructures, each nanostructure having different radiation absorption spectra, the method comprising:
   (a) irradiating the surface at a first wavelength for a first of said plurality of nanostructures that is uniquely absorbed by the first nanostructure such that the first nanostructure is excited to modulate at a frequency corresponding to the first nanostructure frequency;
   (b) irradiating the surface at a second wavelength for a second of said plurality of nanostructures that is uniquely absorbed by the second nanostructure such that the second nanostructure is excited to modulate at a frequency corresponding to the second nanostructure;
   (c) irradiating the surface with an electron beam, wherein when the electron beam is incident on the first nanostructure, wherein at least one of secondary electrons, backscattered electrons and transmitted electrons are modulated at the frequency corresponding to the first nanostructure frequency;
   (d) irradiating the surface with the electron beam, wherein when the electron beam is incident on the second nanostructure, wherein at least one of secondary electrons, backscattered electrons and transmitted electrons are modulated at the frequency corresponding to the second nanostructure frequency; and
   (e) creating a chemical map of the sample at an atomic scale.

2. The method of claim 1, without fluourescence, luminescence and modification of the sample.

3. The method of claim 1, wherein the steps of irradiating the surface with the electron beam is via a narrow focused probe in a scanning electron microscope (SEM).

4. The method of claim 1, wherein the steps of irradiating the surface with a an electron beam is via electron beam a narrow focused probe in scanning transmission electron microscope (STEM).

5. The method of claim 1, wherein the step of irradiating the surface with an electron beam is via a parallel electron beam in a transmission electron microscope (TEM).

6. The method of claim 1, wherein steps (a) through (d) are repeated for at least one additional nanostructure.

7. A photoabsorption microscope to perform chemical identification of a surface having more than one nanostructures, each nanostructure having different radiation absorption spectra, comprising a scanning electron microscope, a scanning transmission electron microscope or a transmission electron microscope, the photoabsorption microscope comprising:
   (a) a laser to irradiate the surface at a first wavelength for a first of said plurality of nanostructures that is uniquely absorbed by the first nanostructure such that the first nanostructure is excited to modulate at a first nanostructure frequency, the laser to irradiate the surface at a second wavelength for a second of said plurality of nanostructures that is uniquely absorbed by the second nanostructure such that the second nanostructure is excited to modulate at a frequency corresponding to the second nanostructure;
   (b) an electron emitter to emit an electron beam on the surface, incident on the first nanostructure, wherein at least one of secondary electrons, backscattered electrons and transmitted electrons are modulated at the frequency corresponding to the first nanostructure frequency, and the electron emitter to emit an electron beam on the surface, wherein when the electron beam is incident on the second nanostructure, at least one of secondary electrons, backscattered electrons and transmitted electrons are modulated at the frequency corresponding to the second nanostructure frequency.
   (c) a detector for measuring at least one of secondary electron yield, backscattered electron distribution, transmitted electron imaging, and electron loss and gain spectrum.

8. The photoabsorption microscope of claim 7, wherein the laser is adapted to irradiate at least one additional nanostructures and the electron emitter is adapted to emit an electron beam on the at least one additional nanostructures.

* * * * *